United States Patent [19]

Reinberg

[11] Patent Number: 5,363,337
[45] Date of Patent: Nov. 8, 1994

[54] INTEGRATED CIRCUIT MEMORY WITH VARIABLE ADDRESSING OF MEMORY CELLS

[75] Inventor: Alan R. Reinberg, Westport, Conn.

[73] Assignee: Micron Technology, Inc., Boise, Id.

[21] Appl. No.: 914,480

[22] Filed: Jul. 15, 1992

[51] Int. Cl.$^5$ ............................................. G11C 8/00
[52] U.S. Cl. ......................... 365/230.06; 365/189.12; 365/239; 365/240
[58] Field of Search ............. 365/230.06, 239, 189.12, 365/240

[56] References Cited

U.S. PATENT DOCUMENTS

| | | | |
|---|---|---|---|
| 4,675,808 | 6/1987 | Grinn et al. | 365/230.02 |
| 4,773,049 | 9/1988 | Takemae | 365/239 |
| 4,845,678 | 7/1989 | Van Berkel et al. | 365/230.06 |
| 5,021,951 | 6/1991 | Baba | 365/230.02 |
| 5,235,545 | 8/1993 | McLaury | 365/230.06 |

Primary Examiner—Eugene R. LaRoche
Assistant Examiner—Son Dinh
Attorney, Agent, or Firm—Dorr, Carson, Sloan & Peterson

[57] ABSTRACT

An integrated circuit memory array has a data input-/output, a Read/Write* signal input, a row decoder, and a column decoder. An input circuit inputs a beginning and ending address to an on-chip memory controller which then sequentially addresses the beginning address, all the cells between the beginning address and the ending address, and the ending address, causing the array to sequentially output or input data from the sequence of cells, depending on the state of the Read/-Write* signal.

9 Claims, 2 Drawing Sheets

INTEGRATED CIRCUIT MEMORY WITH VARIABLE ADDRESSING OF MEMORY CELLS

BACKGROUND OF THE INVENTION

1. Field of the Invention

The invention in general relates to integrated circuit memory arrays and more particularly with an apparatus and method of addressing such memory arrays.

2. Statement of the Problem

The invention to be disclosed herein shall be described with respect to an architecture used in random access memories (RAMs) although it is also applicable to other integrated circuit memories. Integrated circuit RAM memories generally contain a two dimensional array of storage cells arranged in rows and columns. A common architecture is to connect all cells in a row to a common row line, often referred to as the "word line" and all cells in a column to a common column line often called the "bit line" or "digit line". In this architecture, the row line provides a signal which enables cells to receive or output a data signal and the column line provides the input or output line on which the signal is transferred. An individual cell is addressed via a row decoder that selects a row to be addressed and a column decoder which selects a column to be addressed, thereby selecting one particular cell at the corresponding row and column location. The cell is read or written to by placing an enable signal on the row line in the row associated with the addressed cell and reading or writing a signal on the column line associated with the addressed cell. Integrated circuit memories are also generally binary logic circuits in which information is stored and transferred as voltages representing complementary logic values that are alternately referred to as "true and false", "logic 1 and logic 0", or "logic high and logic low". Typically a voltage of 5 volts may represent the logic 1 state while a voltage of zero volts represents the logic 0 state. Generally, the row and column addresses are applied to the integrated circuit memory chip on the same address lines and are multiplexed by a row address signal (RAS) and a column address signal (CAS). Generally, it is the convention to use the inverse signals RAS* and CAS*. For example, when RAS* goes from high to low, the signal on the address lines is gated into a row address register, and a row address decoder connected to the register decodes the address signal and enables the addressed row. When CAS* goes from high to low the signals on the address lines are gated into a column address register, and a column address decoder connected to the column address register then connects the addressed column to the input/output line.

As is well-known, integrated circuit memories are generally mass produced by fabricating hundreds of identical circuit patterns on a single semiconducting wafer, which wafer is subsequently sawed into hundreds of identical dies or chips. The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and circuit performance improves, in particular higher clock speeds are obtainable. However, as more and more individual storage cells are placed onto a single chip, the length of the row and column lines become longer as compared to the size of the individual cell. This increases the capacitance of the system and slows the speed of addressing the cells. As is well known, speed is an important factor in such memories, since the faster the cells can be read, the faster is the computer of which the memory is a part, and the more operations the computer can do. Thus a number of enhancements have been made to RAM architecture to increase the response time. Some enhancements involve increasing the electrical response of the system with sophisticated on-chip amplifiers. Other enhancements involve altering the manner of addressing the cells in the array so that multiple cells may be addressed at the same time. The present invention relates to the latter type of enhancement.

Prior art addressing enhancements are page mode addressing, static column mode addressing, and nibble mode addressing. In page mode addressing, RAS* stays low and CAS* is cycled to gate in a sequence of column addresses. Since RAS* remains low and all cells remain enabled throughout the addressing of the entire sequence, page mode addressing saves the time it takes for RAS* to cycle and the cells in the row to turn on and off, as compared to addressing one cell at a time. Static column mode addressing is similar to page mode addressing except that in this mode CAS* stays low and RAS* cycles. Nibble mode addressing is a multiple-bit addressing mode in which the addressed bit and a set number of bits adjacent the addressed bit are addressed in sequence. These addressing enhancements are generally more efficient if the processing system that addresses the memory generally reads or writes data in blocks that are as about as large or larger than the number of bits addressed in sequence. However, if the processor tends to process data in increments that are smaller than the number of bits in the sequence, then these modes become much less efficient than normal addressing of one cell at a time. Thus there is a need for a mode of addressing that increases the efficiency of the addressing no matter what the size of the data sequences that the processor processes.

SOLUTION TO THE PROBLEM

The present invention solves the above problems by providing multiple addresses to access a block of data.

Preferably, one address is the beginning address of a sequence to be addressed, and a second address is the ending address of the sequence to be addressed. Thus the processor can adjust the sequence to the data being processed. The processor can address any sequence length, and further can address a specific sequence of cells.

The invention also provides a memory controller that utilizes the beginning and ending addresses to address any sequence of addresses in the memory.

The preferred embodiment of the present invention also provides an additional signal input on the chip for receiving a signal that indicates whether the address on the address lines is the beginning of the sequence or the end of the sequence. In addition, the invention provides circuitry for utilizing the beginning/ending signal to gate the beginning and ending addresses into the memory controller.

SUMMARY OF THE INVENTION

The invention provides an integrated circuit memory comprising: a row decoder; a column decoder; a source of a memory input/output signal; address input means for inputting a first cell address and a second cell address to said integrated circuit; memory controller means responsive to said first and second cell addresses for applying the addresses of cells between said first and second cell addresses to said row and column decoders; and a memory cell circuit having an array of cells arranged in a plurality of rows and columns and responsive to said row and column decoder and said input/output signal to output data from said memory cells between said first and second cell addresses and to input data to said memory cells between said first and second cell addresses. Preferably, said first address is a beginning address, said second address is an ending address, said address input means comprises a means for inputting said beginning address and said ending address, and said memory controller means comprises a sequencer means for sequentially applying said beginning address, the addresses of all the cells between said beginning address and said ending address, and said ending address to said row and column decoders. Preferably, said address input means comprises a beginning address register means for registering said beginning address, and an ending address register means for registering said ending address. Preferably, said beginning address register means comprises a beginning row address register and a beginning column address register, and said ending address register means comprises an ending row address register and an ending column address register. Preferably, said address input means further comprises: input means for serially receiving said beginning and ending addresses; and multiplexing means responsive to said serially input beginning and ending addresses for multiplexing said beginning address and ending address parallelly into said beginning address register means and said ending address means, respectively. Preferably, said multiplexing means further comprises a source of a multiplexing signal for clocking said beginning address into said beginning address register means and said ending address into said ending address register means. Preferably, said memory is a RAM memory.

In another aspect the invention comprises an integrated circuit memory comprising: a row decoder; a column decoder; a source of a memory input/output signal; address input means for receiving a beginning and ending address; beginning address register means for receiving said beginning cell address; ending address register means for receiving said ending cell address; memory controller means responsive to said beginning and ending cell addresses for applying the addresses of cells between said beginning and ending cell addresses to said row and column decoders; and a memory cell circuit having an array of cells arranged in a plurality of rows and columns and responsive to said row and column decoder and said input/output signal to output data from said memory cells between said beginning and ending cell addresses and to input data to said memory cells between said beginning and ending cell addresses.

The invention also provides a method of reading or writing a block of data from or to an integrated circuit memory, said method comprising the steps of: providing a beginning address and an ending address to an on-chip memory controller; outputting from said memory controller the addresses of all the cells between said beginning address and ending address; applying said addresses output by said memory controller to the row and column decoders of a memory array circuit and causing said memory array circuit to read or write said block of data depending on the state of a input/output signal. Preferably, said step of providing a beginning and ending address comprises the step of multiplexing a series of row and column addresses into a beginning address register and an ending address register. Preferably, said step of multiplexing further comprises the steps of multiplexing a beginning row address into a beginning row address register, multiplexing a beginning column address into a beginning column address register, multiplexing an ending row address into an ending row address register, and multiplexing an ending column address into an ending column address register.

The invention not only provides an integrated circuit memory that is faster because it can adapt to a variety of data block sizes, but it also uses less power than other integrated circuit memories because not as many superfluous bit and word lines are charged. Numerous other features, objects and advantages of the invention will become apparent from the following description when read in conjunction with the accompanying drawings.

DESCRIPTION OF THE PREFERRED EMBODIMENT

Overview

Figure 1:
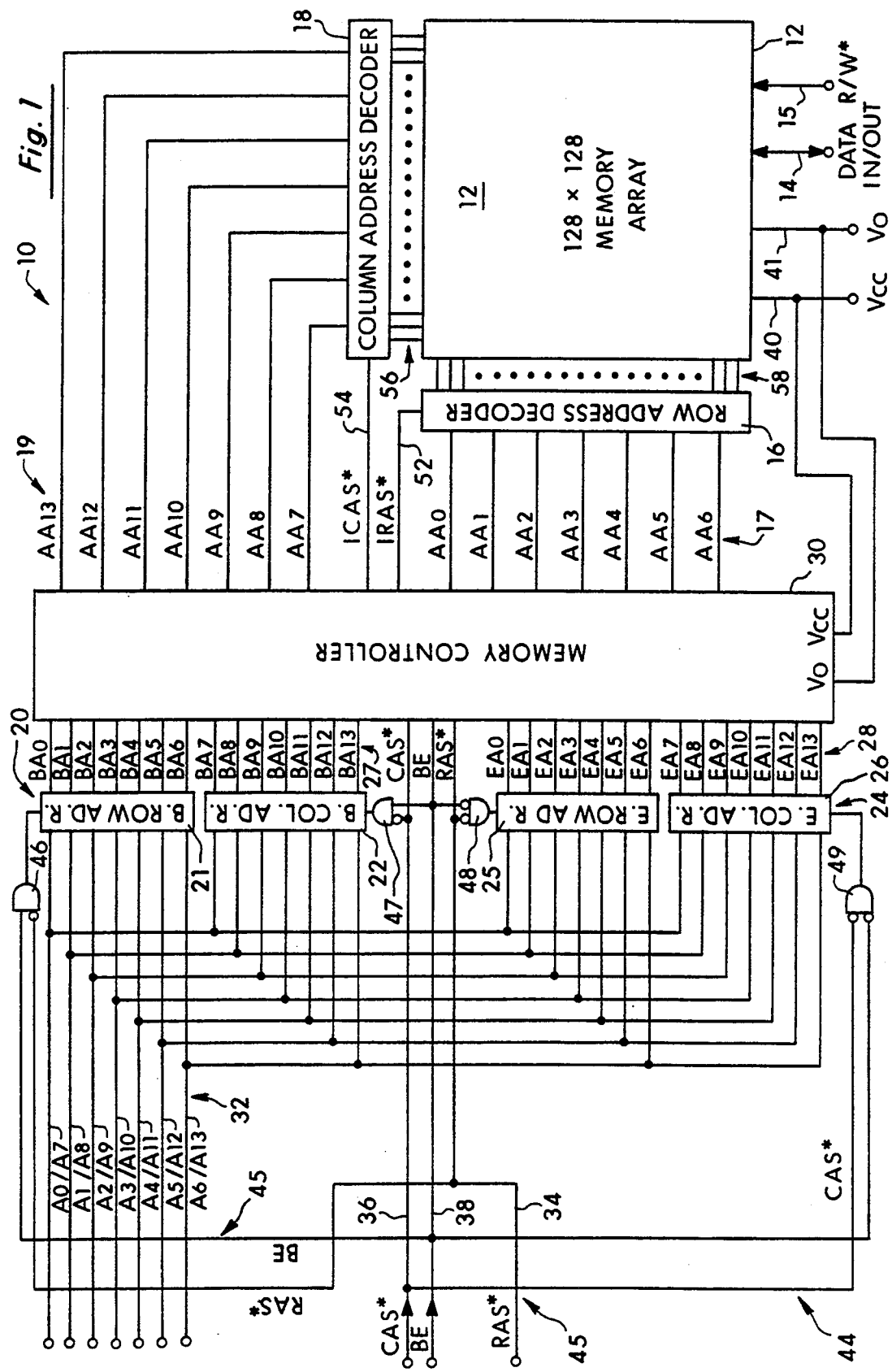
FIG. 1 is a block circuit schematic of the preferred embodiment of an integrated circuit memory according to the invention.

Turning now to FIG. 1, there is shown an integrated circuit memory chip 10 according to the preferred embodiment of the invention. It should be understood that the particular embodiment described herein is exemplary, and is described in detail to more clearly and fully depict the invention than would otherwise be possible; it is not meant to limit the invention to this particular embodiment. The memory chip 10 according to the invention includes a memory array 12 having a data input/output 14, a Read/Write* signal line 15, a row address decoder 16 and a column address decoder 18. The row decoder 16 receives a row address, AA0 through AA6, on lines 17 and enables one row of memory array 12, and column decoder 18 receives a column address, AA7 through AA13 on lines 19 and connects one of the column lines to the input/output 14. This portion of the circuit is the same as for a prior art RAM. However, the integrated circuit 10 according to the invention also includes a beginning address register means 20 comprising beginning row address register 21 and beginning column address register 22, ending address register means 24 comprising ending row address register 25 and ending column address register 26, and memory controller 30. The beginning and ending row and column addresses are input on lines 32, CAS* and RAS* signals are input on lines 36 and 38, respectively, and a signal BE indicating whether the signal on lines 32 is a beginning address or an ending address is input on line 38. The beginning row and column and ending row and column addresses are serially received on input lines 32: first a row address, $A_0$ through $A_6$, is input; then a column address, $A_7$ through $A_{13}$ is input; then another row address, $A_0$ through $A_6$, is input; then another column address, $A_7$ through $A_{13}$ is input. The addresses serially received on inputs 32 are multiplexed parallelly into registers 21, 22, 25 and 26 respectively utilizing the RAS*, CAS*, and BE signals. Beginning address register means 20 applies the beginning address of a sequence to memory controller 30 via lines 27 and ending address register means 24 applies the ending address of a sequence to memory controller 30 via lines 28. Memory controller 30 produces a sequence of addresses, preferably in a manner similar to page mode addressing, on address lines 17 and 19 from the beginning address to the ending address, thereby either outputting a sequence of data signals or inputting a sequence of data signals, depending on the state of Read/-Write* line 15. The beginning and ending addresses input on lines 32 can be virtually any addresses, thus the integrated circuit can adjust to the most efficient addressing for any block of data.

Details of the Integrated Circuit

The integrated circuit chip 10 according to the exemplary embodiment of the invention is a 16K×1 design with 16,384 memory cells in a 128×128 array. It has 14 pins including seven cell address input pins 32, a RAS* input 34, a CAS* input 36, a BE input 38, $V_{CC}$ input 40, $V_0$ input 41, data input/output 14, and Read/Write* signal input 15. It is noted that other signals may be used. For example, a Read*/Write signal could be used in some embodiments, or a read/modify/write signal, or any other signal that directs the input and output of data. We shall designate such a generalized input/output signal as an input/output signal. The address input circuit 44 includes address inputs 32, RAS* line 34, CAS* line 36, BE line 38, beginning row address register 21, beginning column address register 22, ending row address register 25, ending column address register 26, and AND gates 46, 47, 48, and 49. The address lines 32 are connected to each of the registers 21, 22, 25, and 26. The RAS* line 34 is connected to the inverted input of AND gate 46, one inverted input of AND gate 48, and memory controller 30. The CAS* line 36 is connected to the inverted input of AND gate 47, one of the inverted inputs to AND gate 49, and memory controller 30. The BE line 38 is connected to one input of AND gates 46 and 47, one of the inverted inputs of AND gates 48 and 49, and memory controller 30. The outputs 27 and 28 of registers 21, 22, 25, and 26 are connected to memory controller 30.

Figure 2:
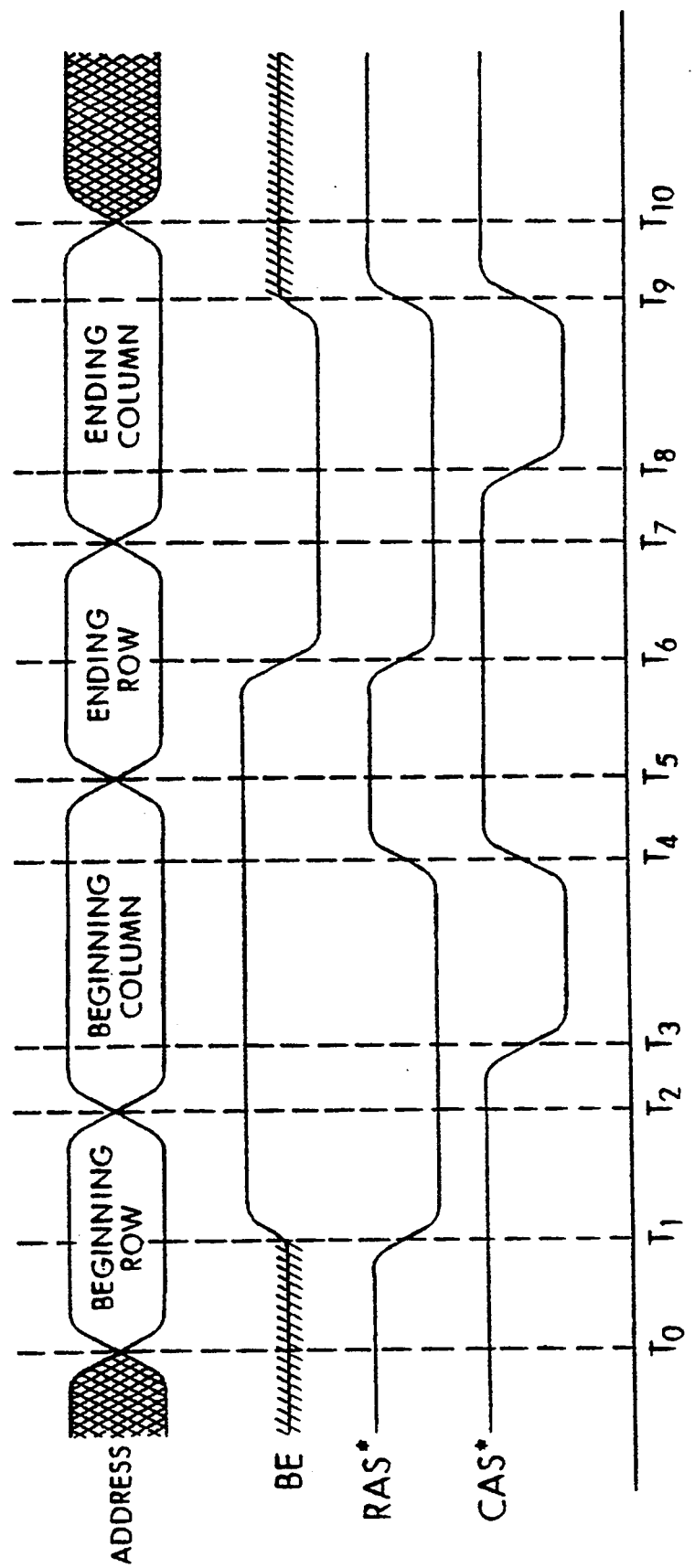
FIG. 2 is a timing diagram of the various signals used in the preferred embodiment of the invention.

The preferred address circuit 44 is a multiplexing circuit 45, including the RAS*, CAS*, and BE inputs 34, 36, and 38, the gates 46 through 49, and the registers 21, 22, 25 and 26, which multiplexing circuit 45 functions as follows. Referring to FIG. 2, the RAS* and CAS* signals are normally high, while the BE signal is normally in a high impedance state (off). When the beginning row address is placed on lines 32, RAS* goes low and BE goes high. The output of AND gate 46 therefore goes high while the outputs of the other gates 47, 48, and 49 stay low. This high on the input of register 21 causes it to latch the beginning row address on lines 32 on its outputs. When the beginning column address is put on line 32, CAS* goes low and BE stays high. This causes the output of AND gate 47 to go high, which causes register 22 to latch the beginning column address on its outputs. RAS* and CAS* then return high. When the ending row address is placed on lines 32, RAS* goes low and BE goes low. This causes the output of AND gate 48 to go high, which causes register 25 to latch the ending row address on its outputs. When the ending column address is placed on lines 32, CAS* goes low and BE stays low. This causes the output of AND gate 49 to go high, which causes register 26 to latch the ending column address on its outputs. RAS* and CAS* then return high and the BE signal returns to high impedance state. The beginning and ending row and column addresses are thus input into memory controller 30. This multiplexing allows the 28 address signals to be input to the chip on only 10 lines. The 28 address signals could also be input parallelly over 28 lines into a single 28 bit address register with no multiplexing. Or the same address signals could be input on 16 lines with only row and column multiplexing, or on 16 lines with only beginning and ending address multiplexing, and the beginning and ending address clocking signal on separate inputs so as to create an edge for clocking each address. However, the preferred embodiment corresponds to the more common address multiplexing using RAS* and CAS* signals.

Memory controller 30 is connected to column address decoder 18 via column address lines 19 and to row address decoder 16 via row address lines 17. Using an internal clock and the RAS*, CAS*, and BE signals, memory controller 30 generates a row address signal, designated IRAS* to differentiate it from the RAS* signal generated externally and input on line 34 and a column address signal, designated ICAS* to differentiate it from the CAS* signal generated externally and input on line 36. The IRAS* signal is applied to the row address decoder 16 via line 52 and the ICAS* signal is applied to the column address decoder 18 via line 54. Column address decoder 18 is connected to the column or "bit" lines 56 of memory array 12 and row address decoder 16 is connected to the row or "word" lines 58 of memory array 12. The $V_{CC}$ line 40 and $V_0$ line 41 connect to both the memory array 12 and memory controller 30. The data input/output line 14 connects to input/output circuitry in memory array 12, which circuitry is of the standard type for a single input/output line. Read/Write* line 15 connects to memory array 12 and R/W* signal functions in the conventional fashion for a single input/output line. Memory controller 30 uses the input beginning and ending addresses to sequentially output row and column addresses starting with the beginning row and column address and ending with the ending row and column address, preferably as in conventional page mode addressing. That is, shortly after CAS* goes low with BE high, indicating the beginning address is available on lines 27, memory controller 30 outputs the beginning row address signal on lines 17 and shortly thereafter drives the internal row address signal (IRAS*) low. Then the memory controller 30 places the beginning column address signal on lines 18 and shortly thereafter drives the internal column address signal (ICAS*) low. A data signal is then either written into memory or read out on input/output line 14 depending on the state of Read/Write* line 15. By that time, the ending address is available on the lines 28, and memory controller 30 then returns ICAS* high, and shortly thereafter it outputs the next column address on lines 19, ICAS* returns low, and another data signal is either written or output. And so on sequentially until either the end of the row is reached or the ending address is reached. If the end of the row is reached first, then memory controller 30 returns IRAS* high and shortly thereafter puts the address of the next row on lines 17, and then drives IRAS* low again, then puts the first column address on lines 19, then shortly thereafter drives ICAS* low, and so on until the ending address is reached. When the ending address is reached, and data is either input or output, then memory controller 30 returns both IRAS* and ICAS* high.

The addressing of the memory array 12 by the memory controller 30 could also be implemented by using a mode similar to static column mode, except that the beginning and end of the static column sequence can vary, or conventional nibble mode addressing, except that the beginning and end of the nibble mode sequence may vary, or a combination of all three. In some embodiments the memory controller may also wait until both the beginning and ending addresses are present on lines 27 and 28 before it begins addressing the array 12, so that it can determine the best mode of addressing.

The data read out of the cell array 12 could also be read out either partially in parallel over several data output lines, or wholly in parallel over many data output lines. Likewise the data written into the cell array 12 could be written in partially in parallel over several data input lines or wholly in parallel over many input lines. There are many ways of inputting and outputting data in parallel or partially in parallel in the art and any could be combined with the invention.

There has been described a novel integrated circuit memory which permits more efficient addressing for a wide variety of block transfers and has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that the advantages of using two separate cell addresses to access a block of data have been demonstrated, many other addressing modes that use two such addresses, other than those described herein, may be substituted. Further, the invention clearly applies to a variety of different memories and memory architectures. Or equivalent components or circuits can be substituted for the various components and circuits described. Other signals may be used. Additional features may be added. A greater or lesser number of parts may be used. Consequently, the invention is to be construed as embracing each and every novel feature and novel combination of features present in and/or possessed by the integrated circuit memory described.

What is claimed is:

1. An integrated circuit memory comprising:
a row decoder;
a column decoder;
a source of a memory input/output signal;
address input means for inputting a first cell address and a second cell address to said intergrated circuit, wherein said first cell address is a beginning address, said second cell address is an ending address, and said address input means comprises a beginning address register means for registering said beginning address and an ending address register means for registering said ending address;
memory controller means responsive to said first and second cell addresses for sequentially applying the addresses of cells between said first and second cell addresses to said row and column decoders; and
a memory cell circuit having an array of cells arranged in a plurality of rows and columns and responsive to said row and column decoder and said input/output signal to output data from said memory cells between said first and second cell addresses and to input data to said memory cell between said first and second cell addresses.

2. An integrated circuit as in claim 1 wherein said beginning address register means comprises a beginning row address register and a beginning column address register, and said ending address register means comprises an ending row address register and an ending column address register.

3. An integrated circuit as in claim 1 wherein said address input means further comprises:
input means for serially receiving said beginning and ending addresses; and
multiplexing means responsive to said serially input beginning and ending addresses for multiplexing said beginning address and ending address parallelly into said beginning address register means and said ending address means, respectively.

4. An integrated circuit as in claim 3 wherein said multiplexing means further comprises a source of a multiplexing signal for clocking said beginning address into said beginning address register means and said ending address into said ending address register means.

5. An integrated circuit as in claim 4 wherein said memory array circuit comprises a RAM memory array.

6. An integrated circuit memory comprising:
a row decoder;
a column decoder;
a source of a memory input/output signal;
address input means for receiving a beginning and ending address;
beginning address register means for receiving said beginning cell address, wherein said beginning address register means comprises a beginning row address register and a beginning column address register;
ending address register means for receiving said ending cell address, wherein said ending address register means comprises an ending row address register and an ending column address register;
memory controller means responsive to said beginning and ending cell addresses for sequentially applying the addresses of cells between said beginning and ending cell addresses to said row and column decoders; and
a memory cell circuit having an array of cells arranged in a plurality of rows and columns and responsive to said row and column decoder and said input/output signal to output data from said memory cells between said beginning and ending cell addresses and to input data to said memory cells between said beginning and ending cell addresses.

7. An integrated circuit memory comprising:
a row decoder;
a column decoder;
a source of a memory input/output signal;
address input means for receiving a beginning and ending address;
beginning address register means for receiving said beginning cell address;
ending address register means for receiving said ending cell address, wherein said address input means further comprises:
serial input means for serially receiving said beginning and ending addresses; and multiplexing means responsive to said serially input beginning and ending addresses for multiplexing said beginning address and said ending address parallelly into said beginning address register means and said ending address means, respectively;

memory controller means responsive to said beginning and ending cell addresses for sequentially applying the addresses of cells between said beginning and ending cell addresses to said row and column decoders; and a memory cell circuit having an array of cells arranged in a plurality of rows and columns and responsive to said row and column decoder and said input/output signal to output data from said memory cells between said beginning and ending cell addresses and to input data to said memory cells between said beginning and ending cell addresses.

8. An integrated circuit as in claim 7 wherein said multiplexing means further comprises a source of a multiplexing signal for clocking said beginning address into said beginning address register means and said ending address into said ending address register means.

9. A method of reading or writing a block of data from or to an integrated circuit memory, said method comprising the steps of:

providing a beginning address and an ending address to an on-chip memory controller, wherein said step of providing a beginning and ending address comprises a step of multiplexing a series of row and column addresses into a beginning address register and an ending address register, wherein said step of multiplexing further comprises steps of multiplexing a beginning row address into a beginning row address register, multiplexing a beginning column address into a beginning column address register, multiplexing an ending row address into a ending row address register, and multiplexing an ending column address into a ending column address register;

sequentially outputting from said memory controller the addresses of all the cells between said beginning address and ending address; and applying said addresses output by said memory controller to the row and column decoders of a memory array circuit and causing said memory array circuit to read or write said block of data depending on the state of an input/output signal.

* * * * *